US008635509B2

(12) United States Patent
Choi et al.

(10) Patent No.: US 8,635,509 B2
(45) Date of Patent: Jan. 21, 2014

(54) METHOD OF OPERATING MEMORY CONTROLLER AND MEMORY SYSTEM INCLUDING THE MEMORY CONTROLLER

(75) Inventors: Seong Hyeog Choi, Hwaseong-si (KR); Jun Jin Kong, Yongin-si (KR); Hong Rak Son, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/612,074

(22) Filed: Sep. 12, 2012

(65) Prior Publication Data

US 2013/0198589 A1  Aug. 1, 2013

(30) Foreign Application Priority Data

Jan. 27, 2012  (KR) .................. 10-2012-0008095

(51) Int. Cl.
*G11C 29/00* (2006.01)
*H03M 13/00* (2006.01)

(52) U.S. Cl.
USPC ........................... 714/755; 714/773; 714/774

(58) Field of Classification Search
USPC .................. 714/773, 746, 751–756, 774, 791
See application file for complete search history.

(56) References Cited

U.S. PATENT DOCUMENTS

| 7,366,013 | B2 | 4/2008 | Roohparvar |
| 7,936,601 | B2 | 5/2011 | Kang et al. |
| 8,468,415 | B2 * | 6/2013 | Radke ........................... 714/755 |
| 2009/0296467 | A1 | 12/2009 | Kim et al. |
| 2010/0064200 | A1 * | 3/2010 | Choi et al. ..................... 714/773 |
| 2010/0315876 | A1 | 12/2010 | Park et al. |
| 2011/0182120 | A1 | 7/2011 | Kang et al. |
| 2011/0258495 | A1 * | 10/2011 | Tseng et al. .................. 714/704 |
| 2012/0110401 | A1 * | 5/2012 | Ryu et al. ...................... 714/721 |
| 2012/0140560 | A1 * | 6/2012 | Yang ....................... 365/185.18 |
| 2012/0254699 | A1 * | 10/2012 | Ruby et al. .................... 714/773 |

FOREIGN PATENT DOCUMENTS

| KR | 100888842 B1 | 1/2009 |
| KR | 20090126073 A | 12/2009 |
| KR | 2010-0133707 A | 12/2010 |

OTHER PUBLICATIONS

Polianskikh, B.; Zilic, Z.; , "Design and implementation of error detection and correction circuitry for multilevel memory protection," Multiple-Valued Logic, 2002. ISMVL 2002. Proceedings 32nd IEEE International Symposium on , vol., No., pp. 89-95, 2002.*
Changhyuk Lee; Sok-kyu Lee; Sunghoon Ahn; Jinhaeng Lee; Wonsun Park; Yongdeok Cho; Chaekyu Jang; Chulwoo Yang; Sanghwa Chung; In-Suk Yun; Byoungin Joo; Byoungkwan Jeong; Jeeyul Kim; Jeakwan Kwon; Hyunjong Jin; Yujong Noh; Jooyun Ha; Moonsoo Sung; Daell Choi; Sanghwan Kim; Jeawon Choi; Taeho Jeon; Heejoung Park; Joong-Seob Yang; Yo-Hwan Koh; , A 32.*

* cited by examiner

*Primary Examiner* — Cynthia Britt
(74) *Attorney, Agent, or Firm* — Harness, Dickey & Pierce, P.L.C.

(57) ABSTRACT

According to example embodiments, a method of controlling a memory controller includes executing an error correction code (ECC) on first page data that has been read from a non-volatile memory device using a first read voltage level, estimating a second read voltage level for reading the first page data using metadata of second page data when an uncorrectable error is detected in the first page data according to a result of executing the ECC.

20 Claims, 17 Drawing Sheets

METHOD OF OPERATING MEMORY CONTROLLER AND MEMORY SYSTEM INCLUDING THE MEMORY CONTROLLER

CROSS-REFERENCE TO RELATED APPLICATIONS

This application claims priority under 35 U.S.C. §119 to Korean Patent Application No. 10-2012-0008095, filed on Jan. 27, 2012 in the Korean Intellectual Property Office (KIPO), the entire contents of which are incorporated herein by reference.

BACKGROUND

Example embodiments of inventive concepts relate to a non-volatile memory device, and more particularly, to a method of operating a memory controller for increasing the speed of a read operation of a non-volatile memory device and reducing a read failure rate and a memory system including the memory controller.

Examples of memory devices used to store computer programs and data are dynamic random access memory (DRAM), static random access memory (SRAM), erasable programmable read-only memory (EPROM), electrically erasable programmable read-only memory (EEPROM), flash memory, and phase-change random access memory (PRAM). Especially, flash memory is non-volatile memory that is capable of enabling electrical reading.

Single-level cell (SLC) memory is memory that stores data of one bit in a single memory cell. SLC memory may also referred to as single-bit cell (SBC) memory. Data of one bit may be written to and read from SLC memory by a voltage belonging to one of two distributions distinguished by a threshold voltage programmed to a memory cell.

Data stored in a memory cell may be classified depending on the difference between memory cell currents/voltages during a read operation. Meanwhile, multi-level cell (MLC) memory that stores data of two or more bits in a single memory cell has been proposed in response to a need for higher integration of memory. MLC memory may also be referred to as a multi-bit cell (MBC) memory.

However, as the number of bits stored in a single memory cell increases, reliability may deteriorate and the read-failure rate may increase. To program "m" bits in a single memory cell, 2 m distributions may be required to be formed. However, since the voltage window of a memory may be limited, the difference in a threshold voltage between adjacent bits may decrease as "m" increases, which may increase the read failure rate.

The threshold voltage distribution of an MLC may change over time due to coupling effect, charge loss, or the like. Moreover, the threshold voltage distribution of the MLC may change with temperature. In order to reduce (and/or minimize) a bit error rate (BER), it is desirable to relatively accurately estimate a read level in a non-volatile memory device.

Flash memory may perform an erase operation in units of memory blocks and may perform a program operation and a read operation in units of pages.

In a conventional method of estimating a read level, when a page that has been read has uncorrectable errors, a read voltage level may be adjusted and the data of the page may be re-read using the adjusted read voltage level. For instance, when least significant bit (LSB) page data that has been read has uncorrectable errors in flash memory including MLCs, an LSB read voltage level may be adjusted and the LSB page data may be re-read using the adjusted read voltage level in the conventional method.

However, this conventional method may not be used to estimate a most significant bit (MSB) page read voltage level when MSB page data read from flash memory including MLCs has uncorrectable errors.

SUMMARY

According to example embodiments of inventive concepts, a method of controlling a memory controller includes executing an error correction code (ECC) on first page data that has been read from a non-volatile memory device using a first read voltage level, and estimating a second read voltage level for reading the first page data using metadata of second page data when an uncorrectable error is detected in the first page data according to a result of executing the ECC.

The estimating the second read voltage level may include transmitting a second page data read command to the non-volatile memory device when the uncorrectable error is detected in the first page data according to the result of executing the ECC; receiving the metadata of the second page data, which is transmitted from the non-volatile memory device in response to the second page data read command; estimating a read voltage level for the second page data based on the metadata; and calculating the second read voltage level based on the read voltage level estimated for the second page data.

The estimating the read voltage level for the second page data may include estimating the read voltage level for reading the second page data so that a difference between a first number of particular bits among bits included in the second page data when the second page data is programmed and a second number of the particular bits included in the second page data that has been read from the non-volatile memory device is at least one of reduced and minimized. The metadata of the second page data may include the first number of the particular bits of the second page data.

The calculating the second read voltage level may include reading the second read voltage level corresponding to the estimated read voltage level from a look-up table.

The method may further include transmitting to the non-volatile memory device a read voltage change command for changing a read voltage level for the first page data from the first read voltage level to the second read voltage level.

The method may further include transmitting a first page data read command to the non-volatile memory device; and receiving the first page data that has been read from the non-volatile memory device using the second read voltage level in response to the first page read command.

The first page data and the second page data may be read from a common page of the non-volatile memory device.

The first page data may be one of most significant bit (MSB) page data and central significant bit (CSB) page data. The second page data may be least significant bit (LSB) page data.

According to example embodiments of inventive concepts, a memory system includes a non-volatile memory device and a memory controller configured to control the non-volatile memory device. The memory controller is configured to execute an error correction code (ECC) on first page data that has been read from the non-volatile memory device using a first read voltage level. The memory controller is configured to transmit a second page data read command to the non-volatile memory device when an uncorrectable error is detected in the first page data according to the result of executing the ECC. The memory controller is configured to receive metadata of second page data from the non-volatile memory device in response to the second page data read command. The memory controller is configured to calculate a read voltage level for the second page data based on the metadata, calculate a second read voltage level based on the read voltage level calculated for the second page data, and to transmit a read voltage change command including information about the second read voltage level to the non-volatile memory device.

The memory controller may be configured to transmit a first page data read command to the non-volatile memory device. The non-volatile memory device may be configured to read the first page data using the second read voltage level and to transmit the first page data that has been read to the memory controller.

The metadata may include information about the number of particular bits among bits included in the second page data when the second page data is programmed.

The first page data may be one of MSB page data and CSB page data. The second page data may be LSB page data.

The memory system may be a multi-chip package that includes the non-volatile memory device and the memory controller.

The memory system may be a memory card, a smart card, or a solid state drive (SSD).

According to example embodiments of inventive concepts, a memory system includes a memory controller connected to a non-volatile memory device. The memory controller is configured to issue a first command to the non-volatile memory device. The non-volatile memory device is configured to transmit first page data that has been read using a first read voltage level to the memory controller in response to the first command. The memory controller is configured to issue a second command to the non-volatile memory device when the memory controller detects an uncorrectable error in the first page data. The non-volatile memory device is configured to transmit metadata of second page data to the memory controller in response to the second command. The memory controller is configured to estimate a read voltage amount for non-volatile memory device to read second page data, based on the metadata of second page data. The memory controller is configured to determine a second read voltage level, based on the read voltage amount, for the non-volatile memory device to read first page data. The memory controller is configured to issue a third command to the non-volatile memory device. The non-volatile memory device is configured to read first page data using the second read voltage level in response to the third command.

The memory controller may be configured to determine the second read voltage level by selecting a value for the second read voltage level correspond to the read voltage amount from a lookup table.

The memory system may be a multi-chip package that includes the non-volatile memory device and the memory controller.

The memory controller may be configured to issue a fourth command to the non-volatile memory device after memory controller issues the third command. The non-volatile memory device may be configured to read the first page data using the second read voltage level such that the first page data read using the second read voltage level has fewer uncorrectable errors than the first page data read using the first read voltage level.

The memory system may further include a substrate supporting the memory controller and the nonvolatile memory device.

The first page data may be one of most significant bit (MSB) page data and central significant (CSB) page data. The second page data may be least significant bit (LSB) page data.

BRIEF DESCRIPTION OF THE DRAWINGS

The above and other features and advantages of example embodiments of inventive concepts will become more apparent by the following description of non-limiting embodiments with reference to the attached drawings, in which like reference characters refer to the same parts throughout the different views. The drawings are not necessarily to scale, emphasis instead being placed upon illustrating the principles of example embodiments of inventive concepts. In the drawings.

DETAILED DESCRIPTION

Figure 1:
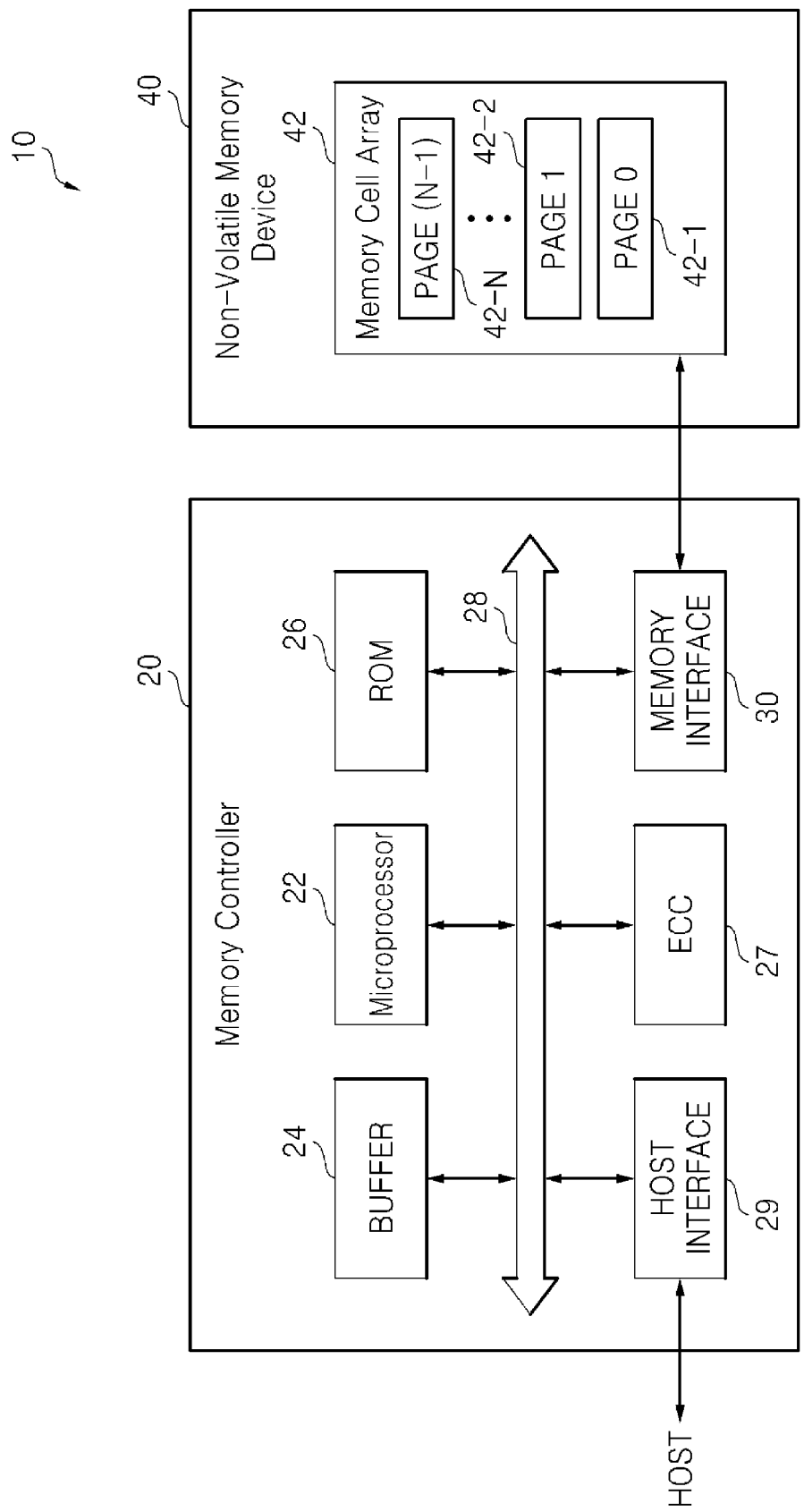
FIG. 1 is a block diagram of a memory system including a memory controller according to example embodiments of inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments Like numbers refer to like elements throughout the description of the figures, and thus their description may be omitted It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a memory system 10 including a memory controller 20 according to example embodiments of inventive concepts. The memory system 10 includes the memory controller 20 and a non-volatile memory device 40.

The memory controller 20 may control the data processing operations, such as a program operation, a read operation, and an erase operation, of the non-volatile memory device 40 according to the control of a host.

The memory controller 20 may control the non-volatile memory device 40 to store as the metadata of second page data (e.g., least significant bit (LSB) page data) the status information of the second page data, e.g., the number of particular bits, e.g., "1s" or "0s", among bits making up the second page data. The second page data and the metadata may be programmed to a second page, e.g., an LSB page.

The memory controller 20 may execute an error correction code (ECC) on first page data, e.g., most significant bit (MSB) page data, read from the non-volatile memory device 40 using a first read voltage level.

When uncorrectable errors are detected in the first page data according to the result of executing the ECC, the memory controller 20 may estimate a second read voltage level for the first page data using the metadata of the second page data. A procedure in which the memory controller 20 estimates the second read voltage level will be described in detail with reference to FIG. 6 later.

The memory controller 20 includes a microprocessor 22, a buffer 24, a read-only memory (ROM) 26, an ECC block 27, a host interface 29, and a memory interface 30. The elements 22, 24, 26, 27, 29 and 30 may communicate with one another through a bus 28.

The microprocessor 22 may be implemented by a circuit, a logic, a code or a combination thereof and may control the operations of the elements 24, 26, 27, 29 and 30.

The buffer 24 may be implemented by volatile memory such as dynamic random access memory (DRAM), static random access memory (SRAM), or dual-port SRAM. The buffer 24 may be configured to temporarily store data output from the non-volatile memory device 40.

The ROM 26 may be configured to store program codes for the operations of the memory controller 20.

The host and the memory controller 20 may communicate with each other via the host interface 29. The host may send a program request and data to be programmed to the non-volatile memory device 40 to the memory controller 20 via the host interface 29. At this time, in response to the program request, the memory controller 20 may generate a page address of a page in the non-volatile memory device 40, in which the data will be stored, and/or a word line address corresponding to the page.

The ECC block 27 detects error bits in data output from the non-volatile memory device 40 and corrects the error bits. The ECC block 27 executes an ECC on first page data, e.g., MSB page data, received from the non-volatile memory device 40. When uncorrectable errors are detected in the first page data according to the result of executing the ECC, the ECC block 27 may send an ECC fail signal to the microprocessor 22.

In response to the ECC fail signal, the microprocessor 22 may control the memory interface 30 to transmit a second page read command for reading the metadata of second page data to the non-volatile memory device 40.

The memory controller 20 and the non-volatile memory device 40 may communicate with each other via the memory interface 30.

The non-volatile memory device 40 includes a memory cell array 42, which includes a plurality of memory blocks. Each of the memory blocks includes a plurality of pages 42-1 through 42-N, each of which includes a plurality of non-volatile memory cells, e.g., NAND flash memory cells. Each of the NAND flash memory cells may store one or more bits.

In the non-volatile memory device 40, e.g., a NAND flash memory device, a program operation and a read operation are performed in units of pages and an erase operation is performed in units of memory blocks.

Here, a page may refer to a memory region defined by a plurality of non-volatile memory cells, e.g., NAND flash memory cells, connected to a single word line. For instance, when each of the NAND flash memory cells is a single-level cell (SLC) that stores one bit, a single word line may be defined as a single page. When each of the NAND flash memory cells is a multi-level cell (MLC) that stores at least two bits, a single word line may be defined to have as many pages as the number of bits programmed to each of a plurality of MLCs connected to the single word line.

For instance, when the MLCs are 2-bit MLCs, the single word line has two pages, e.g., a first page and a second page. The first page and the second page may refer to an MSB page and an LSB page, respectively.

A method of operating the memory controller 20 only when the MLCs are 2-bit MLCs will be described for ease of description, but the method can also be used when the MLCs are 3-bit MLCs. When the MLCs are 3-bit MLCs, the first page may refer to the MSB page or a center significant bit (CSB) page and the second page may refer to the LSB page.

The method can also be used when the MLCs are n-bit MLCs where "n" is 4 or a natural number greater than 4.

Figure 2:
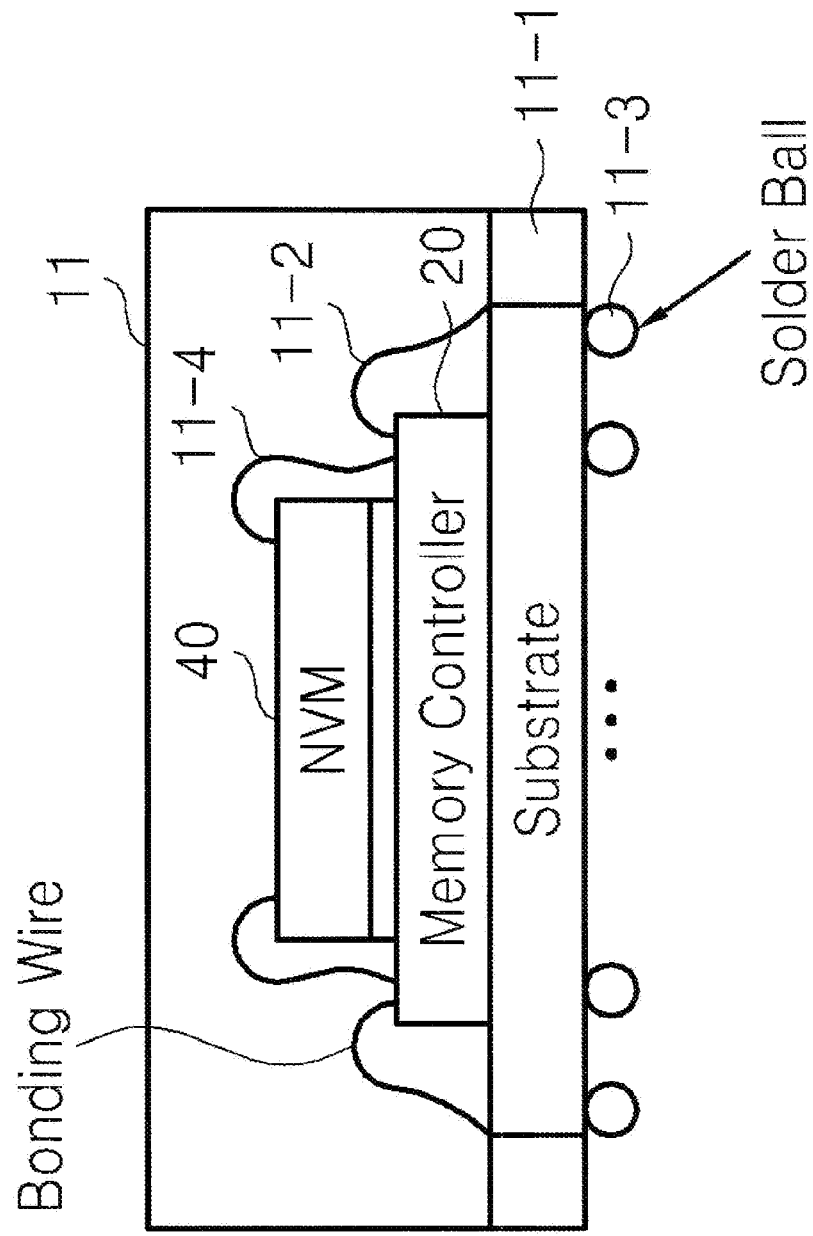
FIG. 2 is a diagram of a multichip package including the memory system illustrated in FIG. 1 according to example embodiments of inventive concepts.

FIG. 2 is a diagram of a multichip package 11 including the memory system 10 illustrated in FIG. 1 according to example embodiments of inventive concepts. Referring to FIG. 2, the multichip package 11 includes the memory controller 20 mounted or stacked on a circuit substrate 11-1, e.g., a printed circuit board (PCB); and the non-volatile memory device 40 mounted or stacked on the memory controller 20. The memory controller 20 communicates with external devices through bonding wires 11-2 and solder balls 11-3. In addition, the memory controller 20 communicates with the non-volatile memory device 40 through bonding wires 11-4.

For ease of description, FIG. 2 illustrates the a-non-volatile memory device 40 is on the memory controller 20, but example embodiments of inventive concepts are not limited thereto and the positions of the two elements 20 and 40 may be different.

The memory controller 20 and the non-volatile memory device 40 may communicate with each other using connecting means other than the bonding wires 11-4. Moreover, the memory controller 20 and the solder balls 11-3 may be connected with each other using connecting means other than the bonding wires 11-2. The connecting means may be implemented by a vertical electrical element, e.g., a through silicon via (TSV).

Figure 3:
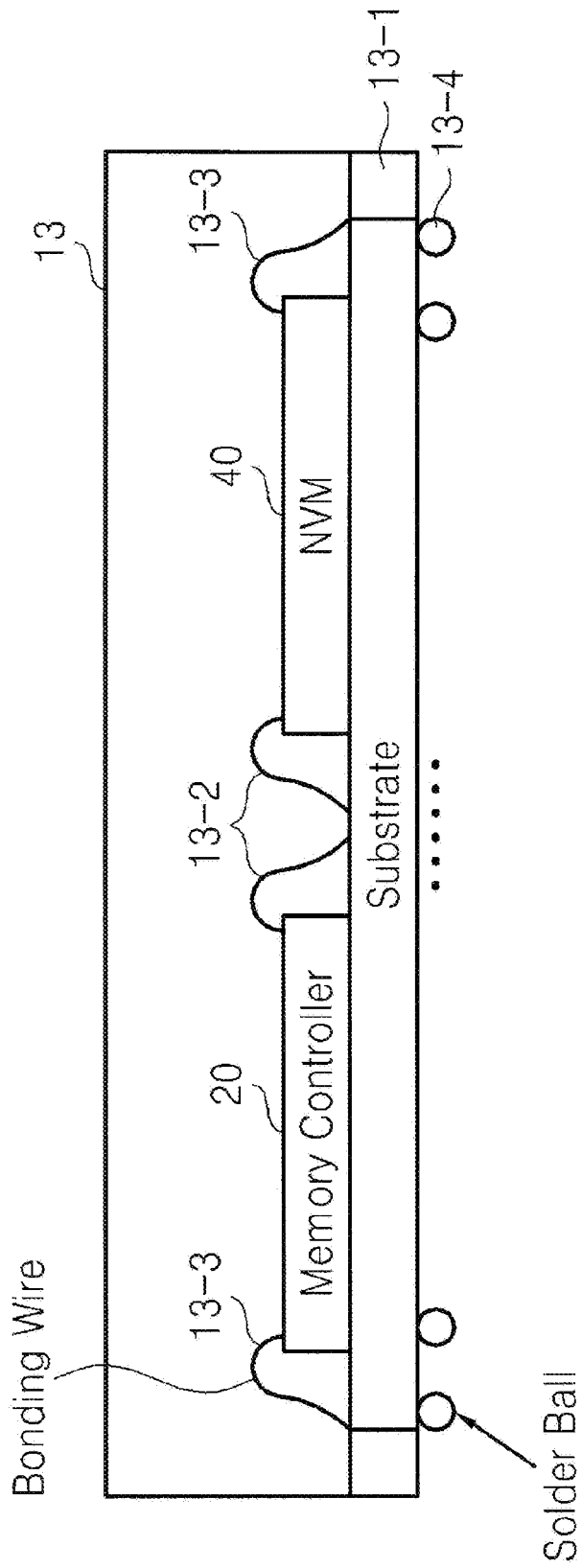
FIG. 3 is a diagram of a multichip package including the memory system illustrated in FIG. 1 according to example embodiments of inventive concepts.

FIG. 3 is a diagram of a multichip package 13 including the memory system 10 illustrated in FIG. 1 according to example embodiments of inventive concepts. Referring to FIG. 3, the multichip package 13 includes the memory controller 20 and the non-volatile memory device 40, which are connected to a circuit substrate 13-1, e.g., a PCB. The memory controller 20 and the non-volatile memory device 40 communicate with each other through bonding wires 13-2 and with external devices through the bonding wires 1303 and solder balls 13-4.

The memory controller 20 and the non-volatile memory device 40 may communicate with each other using connecting means other than the bonding wires 13-2. The connecting means may be implemented as a vertical electrical element, e.g., a TSV.

When the memory controller 20 and the non-volatile memory device 40 are connected to the circuit substrate 13-1 through vertical electrical elements, the memory controller 20 and the non-volatile memory device 40 may communicate with each other through the vertical electrical elements and the circuit substrate 13-1.

The memory controller 20 and the non-volatile memory device 40 may be implemented in separate chips, respectively, and may be packaged using a Package on Package (PoP), a Ball Grid Array (BGA), a Chip Scale Package (CSP), a Plastic Leaded Chip Carrier (PLCC), a Plastic Dual In-line Package (PDIP), a Chip On Board (COB), a CERamic Dual In-line Package (CERDIP), a plastic Metric Quad Flat Pack (MQFP), a Thin Quad Flat Pack (TQFP), a Small Outline Integrated Circuit (SOIC), a Shrink Small Outline Package (SSOP), a Thins Small Outline Package (TSOP), a System In Package (SIP), a Multi Chip Package (MCP), a Wafer-level Fabricated Package (WFP), or a Wafer-level processed Stack Package (WSP). However, example embodiments of inventive concepts are not limited thereto.

Figure 4:
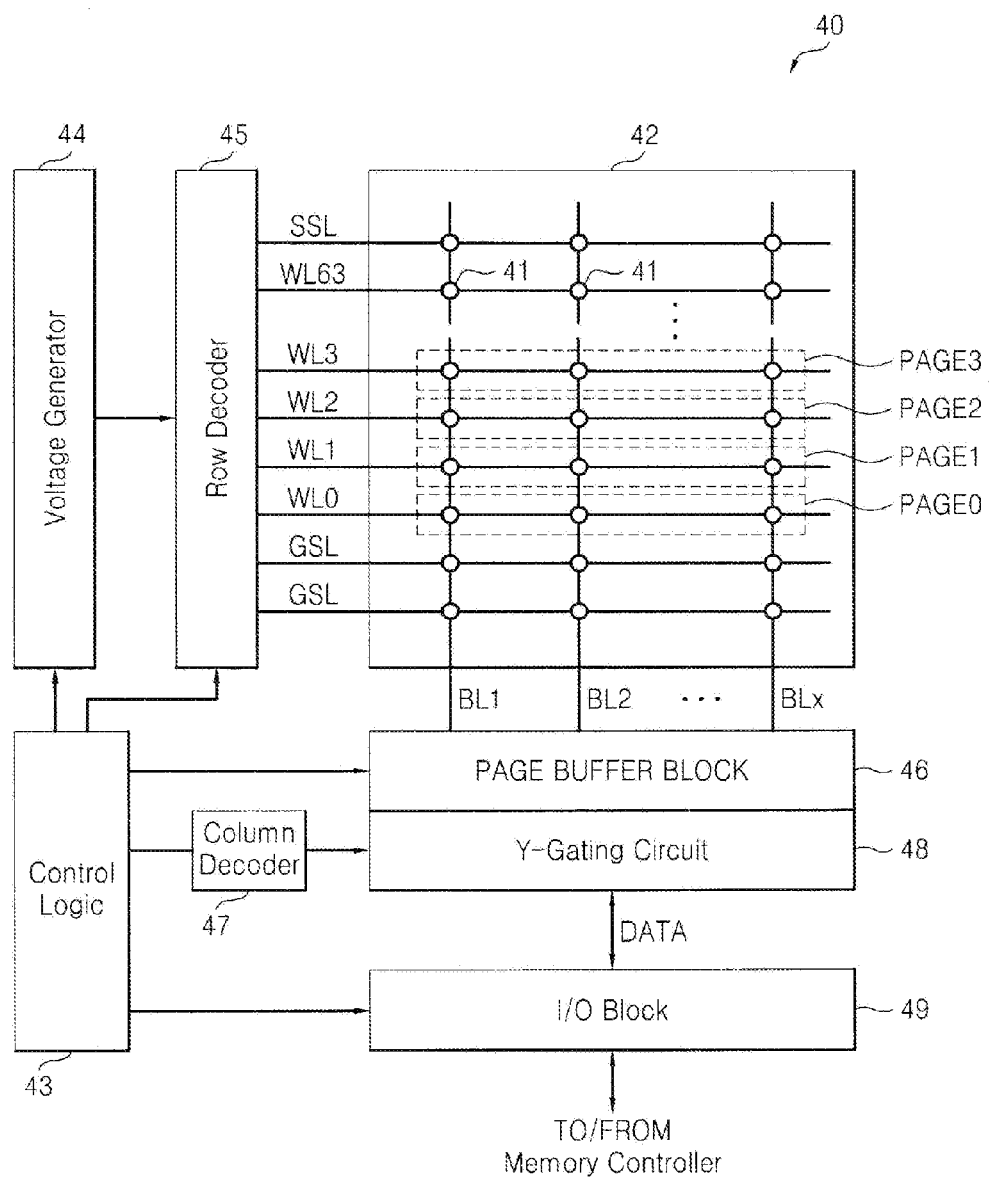
FIG. 4 is a block diagram of a non-volatile memory device illustrated in FIG. 1, which has a two-dimensional structure.

FIG. 4 is a block diagram of the non-volatile memory device 40 illustrated in FIG. 1, which has a two-dimensional structure. Referring to FIGS. 1 and 4, the non-volatile memory device 40, e.g., a NAND flash memory device, includes a memory cell array 42 configured to store data, a control logic 43, a voltage generator 44, a row decoder 45, a page buffer block 46, a column decoder 47, a Y-gating circuit 48, an input/output (I/O) block 49.

The memory cell array 42 includes a plurality of NAND memory cell strings. Each of the NAND memory cell string may include a plurality of NAND memory cells 41 connected in series. For instance, a first NAND memory cell string includes a plurality of NAND memory cells 41 connected in series between a first selection transistor (or a string selection transistor) connected to a bit line BL1 and a second selection transistor (or a ground selection transistor) connected to a common source line (CSL).

A gate of the first selection transistor is connected to a string selection line (SSL). Gates of the respective NAND memory cells are connected to a plurality of word lines WL0 through WL63, respectively. A gate of the second selection transistor is connected to a ground selection line (GSL).

As described above, when each memory cell 41 is an SLC, word lines, e.g., WL0 through WL3, may define pages PAGE0 through PAGE3, respectively.

FIG. 4 shows the memory cell array 42 including the 64 word lines WL0 through WL63, but the number of word lines is not restricted to 64.

Figure 5:
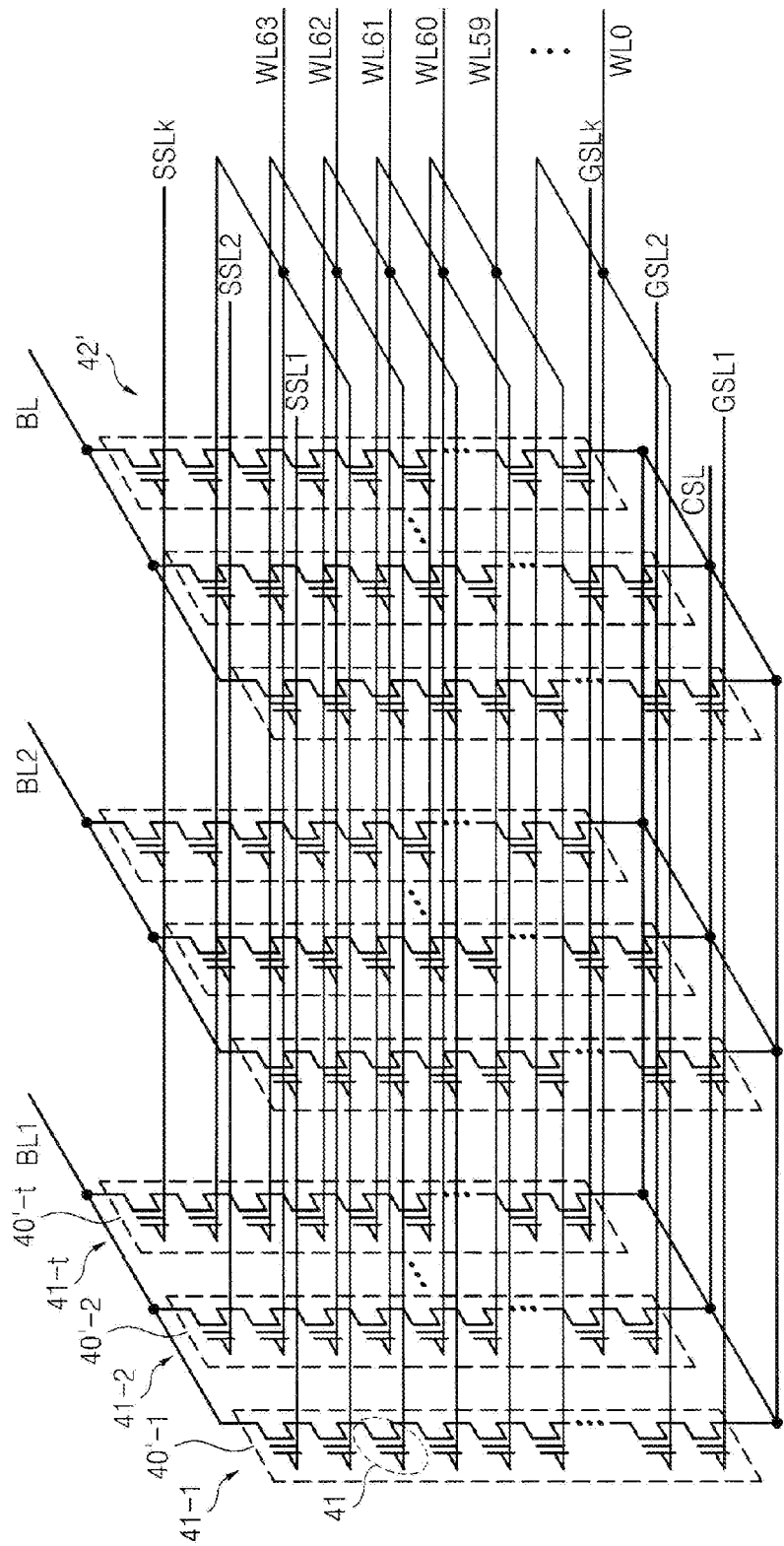
FIG. 5 is a diagram of a memory cell array having a three-dimensional structure in the non-volatile memory device illustrated in FIG. 1.

FIG. 5 is a diagram of a memory cell array 42' having a three-dimensional structure in the non-volatile memory device 40 illustrated in FIG. 1. Referring to FIGS. 1 and 5, NAND memory cell strings 40'4, 40'-2, ..., 40'-t (where "t" is a natural number) may be laid out on different planes in three dimensions.

As illustrated in FIG. 5, the first NAND memory cell string 40'-1 may be laid out on a first layer 41-1, the second NAND memory cell string 40'-2 may be laid out on a second layer 41-2 different from the first layer 41-1, and the t-th NAND memory cell string 40'-t may be laid out on a layer 41-t different from the second layer 41-2.

The layers 41-1 through 41-t may be formed in a wafer stack, a chip stack, or a cell stack. The layers 41-1 through 41-t may be connected with one another using a bump, a vertical electrical element including a TSV, or wire bonding. Each of the layers 41-1 through 41-t includes a plurality of cell strings.

As illustrated in FIG. 5, the NAND memory cell strings 40'-1 through 40'-t may share the word lines WL0 through WL63, the CSL, and the bit line BL1 with one another.

A memory cell array described hereinafter generally includes the two-dimensional memory cell array 42 illustrated in FIG. 4 and the three-dimensional memory cell array 42' illustrated in FIG. 5 in the example embodiments of inventive concepts.

The control logic 43 may be implemented by a circuit, a logic, a code or a combination thereof. The control logic 43 controls the data processing operations, e.g., a program operation, a read operation, and an erase operation, of the NAND flash memory device 40. For instance, the control logic 43 controls the operations of the elements 44 through 49 to perform the data processing operations in response to a plurality of control signals output from the memory controller 20.

The voltage generator 44 may generate a plurality of voltages including a program voltage necessary for the program operation, a plurality of voltages including a read voltage necessary for the read operation, or a plurality of voltages including an erase voltage necessary for the erase operation. The voltage generator 44 may output the voltages necessary for each operation to the row decoder 45.

The row decoder 45 applies the voltages output from the voltage generator 44 to the word lines WL0 through WL63 according to a row address output from the control logic 43.

The column decoder 47 decodes a column address and outputs a plurality of select signals to the Y-gating circuit 48 under the control of the control logic 43.

The page buffer block 46 includes a plurality of page buffers. The page buffers are respectively connected to a plurality of bit lines BL1 through BLx (where "x" is a natural number). Each of the page buffers may operate as a driver, which programs data to the memory cell array 42, during a program operation under the control of the control logic 43. Each page buffer may operate as a sense amplifier, which senses and amplifies a voltage level of one of the bit lines BL1 through BLx, during a read operation or a verify operation according to the control of the control logic 43.

The Y-gating circuit 48 may control data transmission between the page buffer block 46 and the I/O block 49 in response to a plurality of select signals output from the column decoder 47.

The I/O block 49 may transmit data received from the memory controller 20 to the Y-gating circuit 48 and may transmit data output from the Y-gating circuit 48 to the memory controller 20 through a plurality of I/O pins or a data bus.

Figure 6:
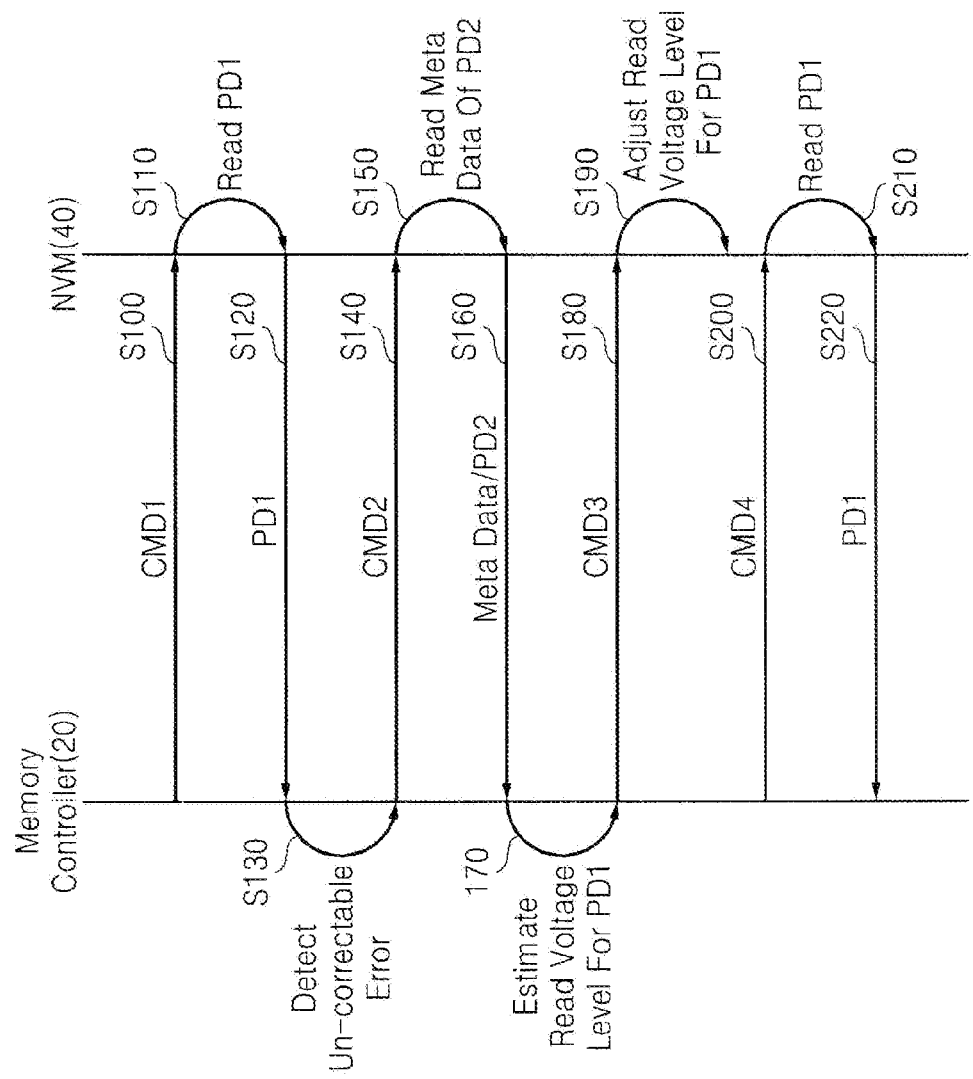
FIG. 6 is a diagram showing the schematic data flow used in the memory system illustrated in FIG. 1.

FIG. 6 is a diagram showing the schematic data flow used in the memory system 10 illustrated in FIG. 1. Referring to FIGS. 1 and 6, the memory controller 20 transmits a first page read command CMD1 for reading first page data PD1, e.g., MSB page data, to the non-volatile memory device 40 in operation S100.

The non-volatile memory device 40 reads the first page data PD1 in response to the first page read command CMD1 in operation S110 and transmits the read first page data PD1 to the memory controller 20 in operation S120. The first page data PD1 may be read using a first read voltage level.

The memory controller 20 executes the ECC on the received first page data PD1 in operation S130. When an uncorrectable error is detected in the received first page data PD1 according to the result of executing the ECC, the memory controller 20 transmits a second page read command CMD2 for reading second page data PD2, e.g., LSB page data, to the non-volatile memory device 40 in operation S140.

The non-volatile memory device 40 reads the second page data PD2 in response to the second page read command CMD2 in operation S150 and transmits the read second page data PD2 to the memory controller 20 in operation S160. Alternatively, the non-volatile memory device 40 may read metadata of the second page data PD2 in response to the second page read command CMD2 and transmit the read metadata to the memory controller 20.

The metadata may include information about the number of particular bits among bits included in the second page data PD2 when the second page data PD2 is programmed. However, example embodiments of inventive concepts are not limited thereto.

The memory controller 20 estimates a read voltage level for the second page data PD2 based on the metadata of the second page data PD2 and calculates a second read voltage level for the first page data PD1 based on the read voltage level estimated for the second page data PD2 in operation S170.

The memory controller 20 may estimate the read voltage level for the second page data PD2 to reduce (and/or minimize) a difference between the number of particular bits, which are included in the meta data, among the bits included in the second page data PD2 to be programmed and the number of particular bits among bits included in the second page data PD2 that has been read.

A procedure for estimating a read voltage level for the second page data PD2 will be described in detail with reference to FIGS. 7 and 8 later.

The memory controller 20 calculates the second read voltage level for the first page data PD1 based on the read voltage level estimated for the second page data PD2. Alternatively, the memory controller 20 may read the second read voltage level corresponding to the read voltage level estimated for the second page data PD2 from a look-up table. The look-up table may be stored in the ROM 26.

The memory controller 20 may calculate the second read voltage level using Equations 1 and 2:

$$R_1 = R_2 - A, \quad (1)$$

$$R_3 = R_2 + B, \quad (2)$$

where R2 denotes the read voltage level estimated for the second page data PD2, R1 or R3 denotes the second read voltage level, and A and B are distribution widths determined depending on R2. The distribution width A or B may be a value obtained by experimentally measuring and modeling the non-volatile memory device 40.

The memory controller 20 transmits a read voltage change command CMD3 for changing a read voltage level for the first page data PD1 from the first read voltage level to the second read voltage level to the non-volatile memory device 40 in operation S180.

The non-volatile memory device 40 changes the read voltage level for the first page data PD1 from the first read voltage level to the second read voltage level in response to the read voltage level change command CMD3 in operation S190.

The memory controller 20 transmits a first page read command CMD4 to the non-volatile memory device 40 in operation S200. The non-volatile memory device 40 reads the first page data PD1 in response to the first page read command CMD4 in operation S210 and transmits the read first page data PD1 to the memory controller 20 in operation S220. Consequently, the memory controller 20 can receive first page data that does not include uncorrectable errors from the non-volatile memory device 40.

Figure 7:
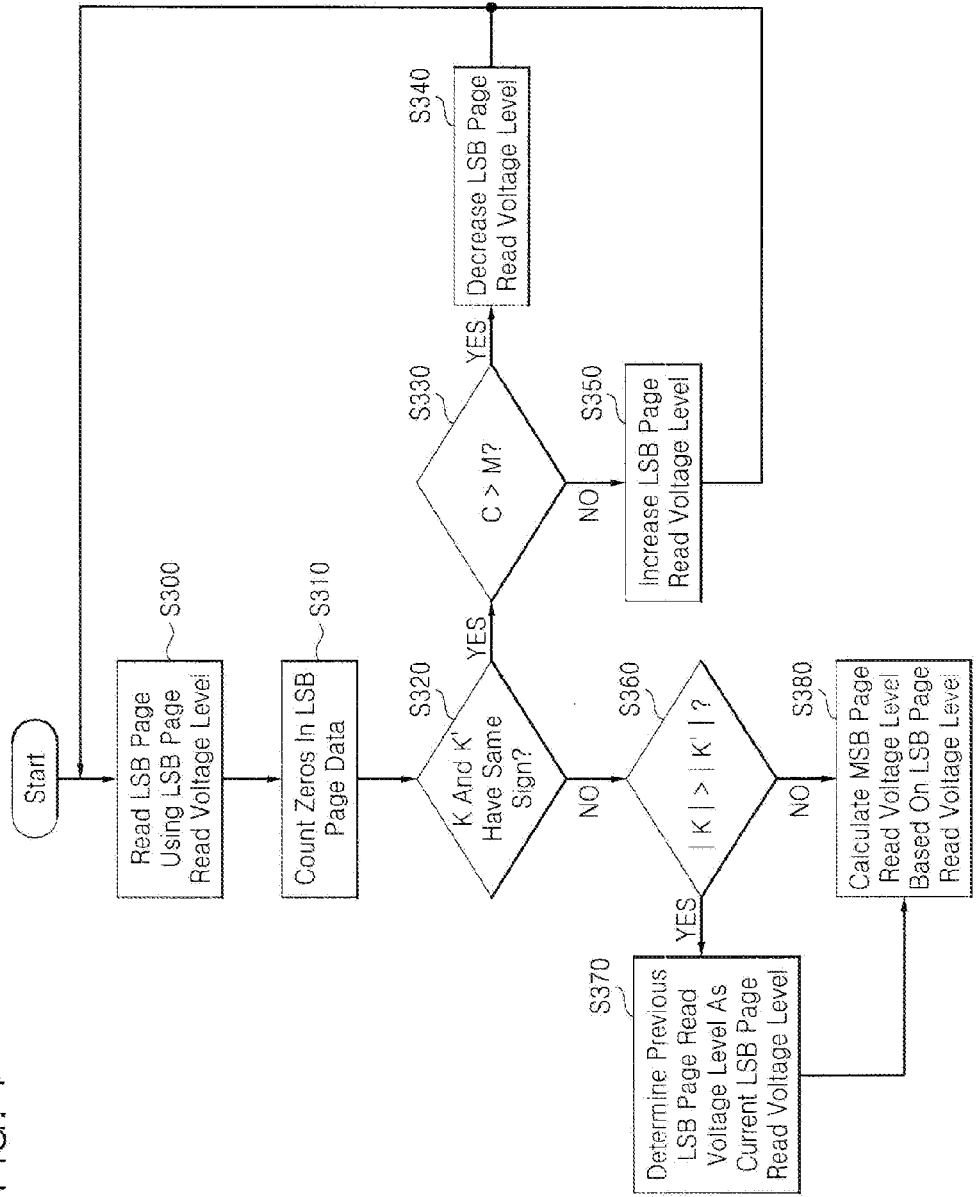
FIG. 7 is a flowchart of a method of estimating an ideal read level using the memory controller illustrated in FIG. 1 according to example embodiments of inventive concepts.

FIG. 7 is a flowchart of a method of estimating an ideal read level using the memory controller 20 illustrated in FIG. 1 according to example embodiments of inventive concepts. Referring to FIG. 7, the memory controller 20 receives second page data, e.g., LSB page data, which has been read using a read voltage level for the second page data, e.g., an LSB page read voltage level, from the non-volatile memory device 40 in operation S300 and counts the number C of particular bits, e.g., 1s, among bits included in the second page data that has been read in operation S310.

The memory controller 20 calculates K=C−M, where M is the number of particular bits among bits included in the second page data when the second page data is programmed. A value of M may be included in the metadata of the second page data. The memory controller 20 compares the sign of the value K with the sign of a value K' in operation S320, where K'=C'−M and C' is the number of particular bits among bits included in second page data that has been read previously.

When K and K' have the same sign, the memory controller 20 compares C with M in operation S330. When C is greater than M, the memory controller 20 decreases the read voltage level for the second page data in operation S340. When C is not greater than M, the memory controller 20 increases the read voltage level for the second page data in operation S350.

When K and K' have different signs from each other, the memory controller 20 compares the absolute value of K with the absolute value of K' in operation S360. When the absolute value of K is greater than the absolute value of K', the memory controller 20 determines a read voltage level related with C' or K', i.e., a previous read voltage level as the current read voltage level for the second page data in operation S370 and then calculates a read voltage level for first page data, e.g., MSB page data, based on the determined read voltage level for the second page data in operation S380.

When the absolute value of K is not greater than the absolute value of K', the memory controller 20 calculates a read voltage level for the first page data based on the current read voltage level for the second page data in operation S380.

Figure 8:
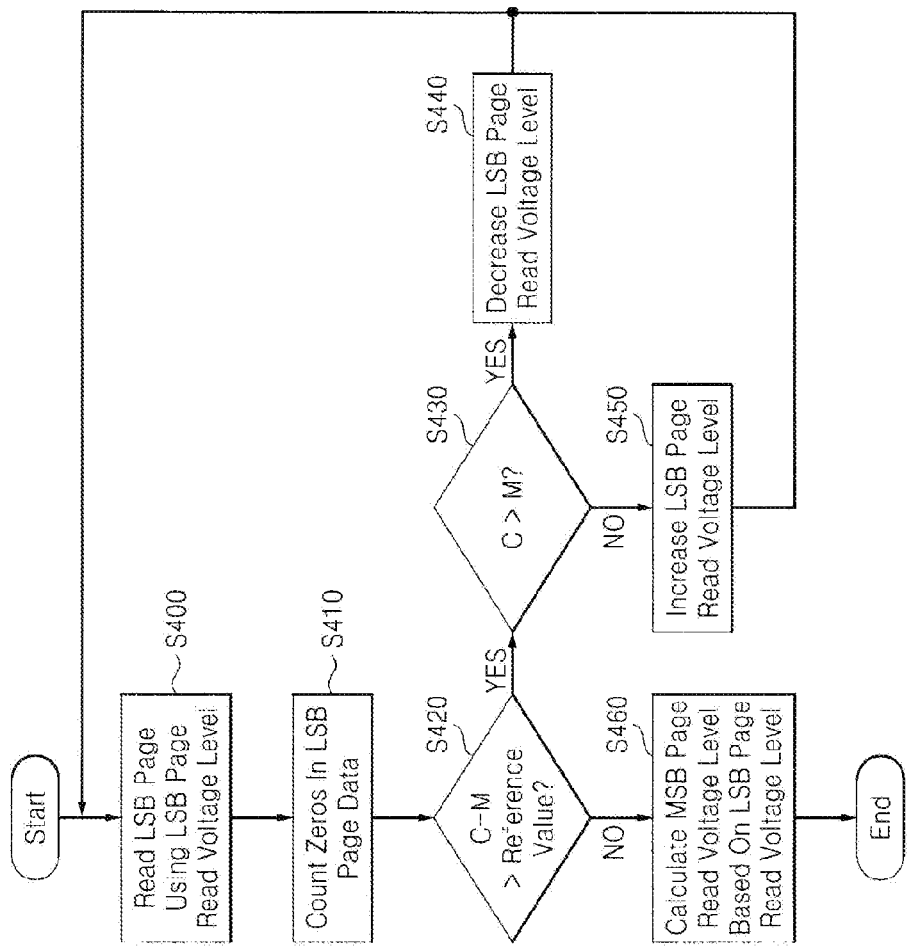
FIG. 8 is a flowchart of a method of estimating an ideal read level using the memory controller illustrated in FIG. 1 according to example embodiments of inventive concepts.

FIG. 8 is a flowchart of a method of estimating an ideal read level using the memory controller 20 illustrated in FIG. 1 according to example embodiments of inventive concepts. Referring to FIG. 8, the memory controller 20 receives second page data, e.g., LSB page data, which has been read using a read voltage level for the second page data, e.g., an LSB page read voltage level, from the non-volatile memory device 40 in operation S400 and counts the number C of particular bits, e.g., 1s, among bits included in the second page data that has been read in operation S410.

The memory controller 20 compares C less M with a reference value in operation S420, where M is the number of particular bits among bits included in the second page data when the second page data is programmed. A value of M may be included in the metadata of the second page data.

When the C less M is greater than the reference value, the memory controller 20 compares C with M in operation S430. When C is greater than M, the memory controller 20 decreases the read voltage level for the second page data in operation S440. When C is not greater than M, the memory controller 20 increases the read voltage level for the second page data in operation S450. When the C less M is not greater than the reference value, the memory controller 20 calculates a read voltage level for the first page data based on the read voltage level for the second page data in operation S460.

Figure 9:
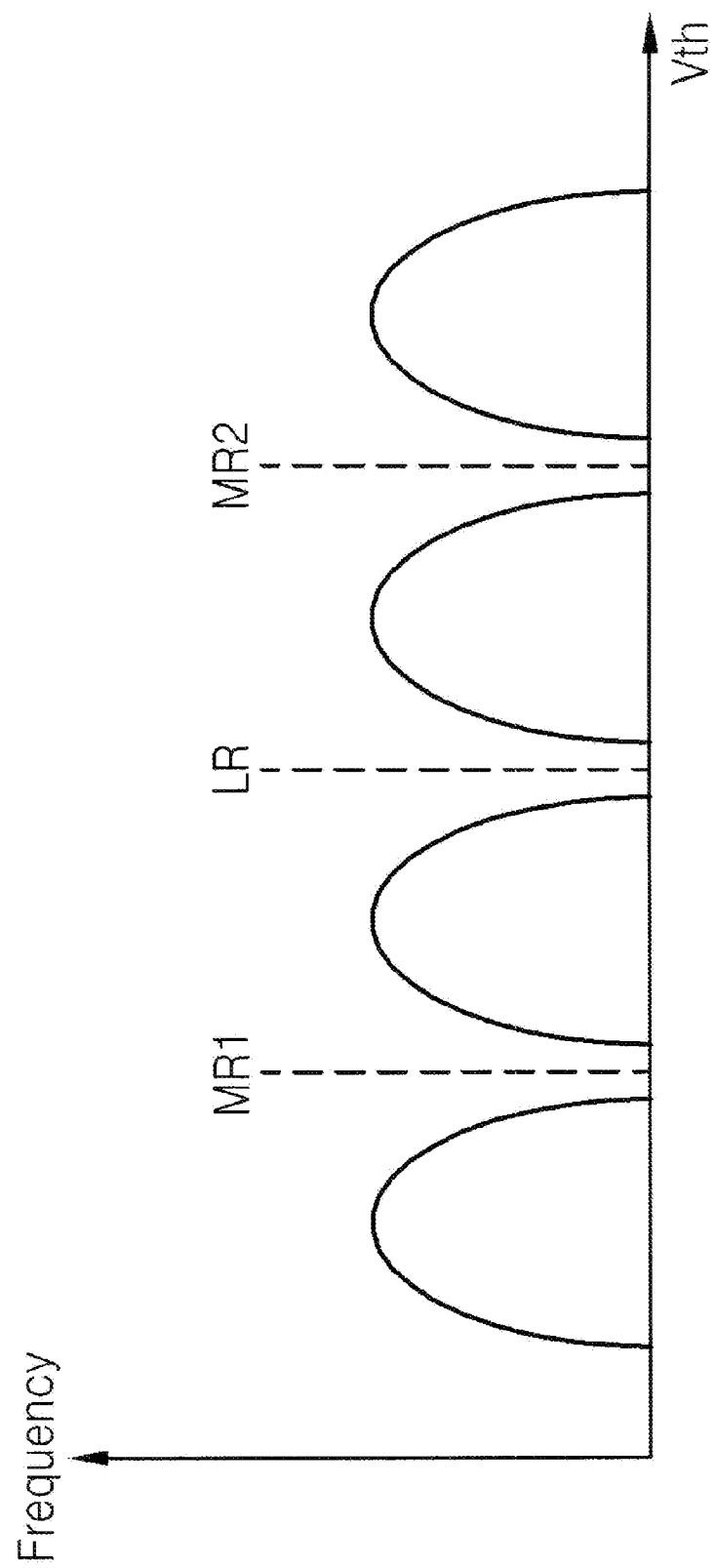
FIGS. 9 and 10 are diagrams for explaining how the memory controller illustrated in FIG. 1 estimates an ideal read level.
Figure 10:
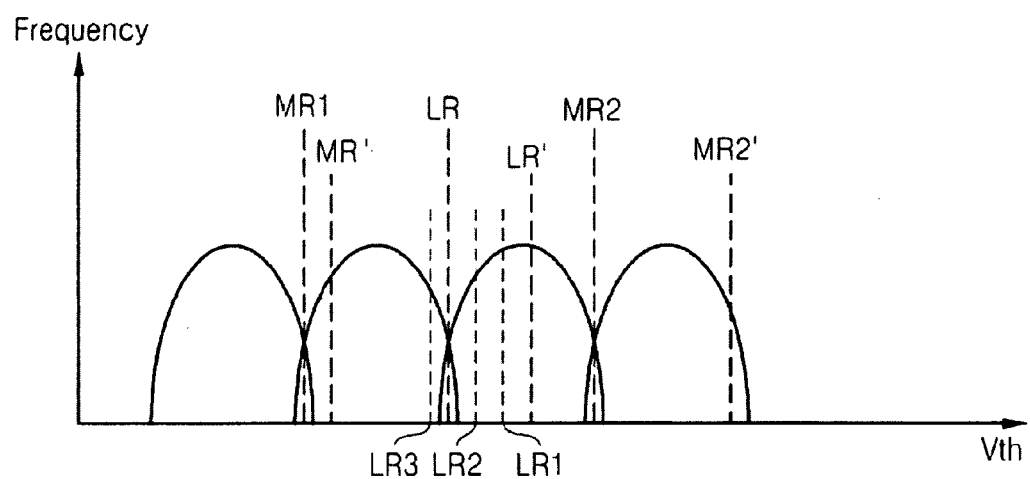

FIGS. 9 and 10 are diagrams for explaining how the memory controller 20 illustrated in FIG. 1 estimates an ideal read level. Referring to FIG. 9, since a read voltage level LR, MR1, or MR2 is positioned between distributions, first page data and second page data do not have uncorrectable errors.

However, the distributions may change over time or temperature. Referring to FIG. 10, each of the distributions may overlap respectively. Accordingly, the first or second page data that has been read using the read voltage level MR1, MR2, or LR may have uncorrectable errors.

In this case, the memory system 10 reads the second page data using the read voltage level LR sequentially changed to candidate read voltage levels LR1, LR2, and LR3. The memory system 10 may determine the most ideal candidate read voltage level as an estimated read voltage level LR' based on second page data that has been read using each of the candidate read voltage levels LR1, LR2, and LR3.

The memory system 10 may calculate a new read voltage level MR1' or MR2' for the first page data based on the estimated read voltage level LR'. Alternatively, the memory system 10 may read the new read voltage level MR1' or MR2' corresponding to the estimated read voltage level LR' from a look-up table.

The most ideal candidate read voltage level is a candidate read voltage level that gives a minimum difference between the number of particular bits in the second page data that has been read and the number of particular bits in the second page data that would be programmed among the candidate read voltage levels LR1, LR2, and LR3.

Figure 11:
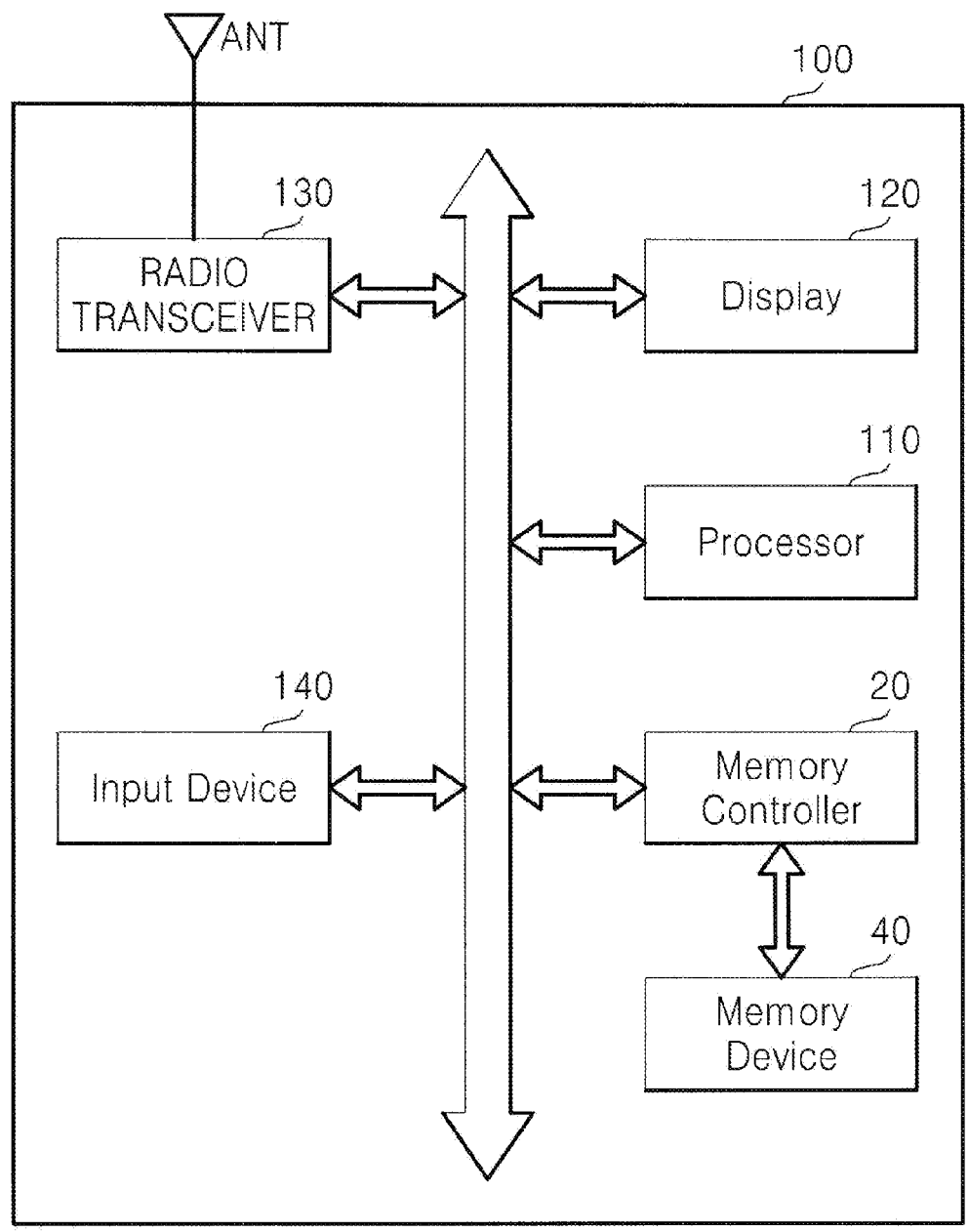
FIG. 11 is a diagram of an electronic device including the memory system illustrated in FIG. 1 according to example embodiments of inventive concepts.

FIG. 11 is a diagram of an electronic device 100 including the memory system 10 illustrated in FIG. 1 according to example embodiments of inventive concepts. Referring to FIG. 11, the electronic device 100 may be implemented as a cellular/mobile phone, a smart phone, a tablet personal computer (PC), a personal digital assistant (PDA), a video game console, or a handheld communication device. However, example embodiments of inventive concepts are not limited thereto.

The electronic device 100 includes the memory controller 20 and the non-volatile memory device 40. The memory controller 20 may control the data processing operations, e.g., a program operation, an erase operation, and a read operation, of the non-volatile memory device 40 according to the control of a processor 110.

Data programmed to the non-volatile memory device 40 may be displayed through a display 120 according to the control of the processor 110 and/or the memory controller 20. The display 120 may be implemented by a flat panel display such as a thin film transistor-liquid crystal display (TFT-LCD), a light emitting diode (LED) display, an organic LED (OLED) display, or an active matrix OLED (AMOLED) display.

A radio transceiver 130 transmits or receives radio signals through an antenna ANT. The radio transceiver 130 may convert radio signals received through the antenna ANT into signals that can be processed by the processor 110.

Accordingly, the processor 110 may process the signals output from the radio transceiver 130 and transmit the processed signals to the memory controller 20 or the display 120. The memory controller 20 may program the signals processed by the processor 110 to the non-volatile memory device 40. The radio transceiver 130 may also convert signals output from the processor 110 into radio signals and outputs the radio signals to an external device through the antenna ANT.

An input device 140 enables control signals for controlling the operation of the processor 110 or data to be processed by the processor 110 to be input to the memory system 100. The input device 140 may be implemented by a pointing device such as a touch pad or a computer mouse, a keypad, or a keyboard.

The processor 110 may control the operation of the display 120 to display data output from the memory controller 20, data output from the radio transceiver 130, or data output from the input device 140. The memory controller 20, which controls the operations of the non-volatile memory device 40, may be implemented as a part of the processor 110 or as a chip separated from the processor 110.

Figure 12:
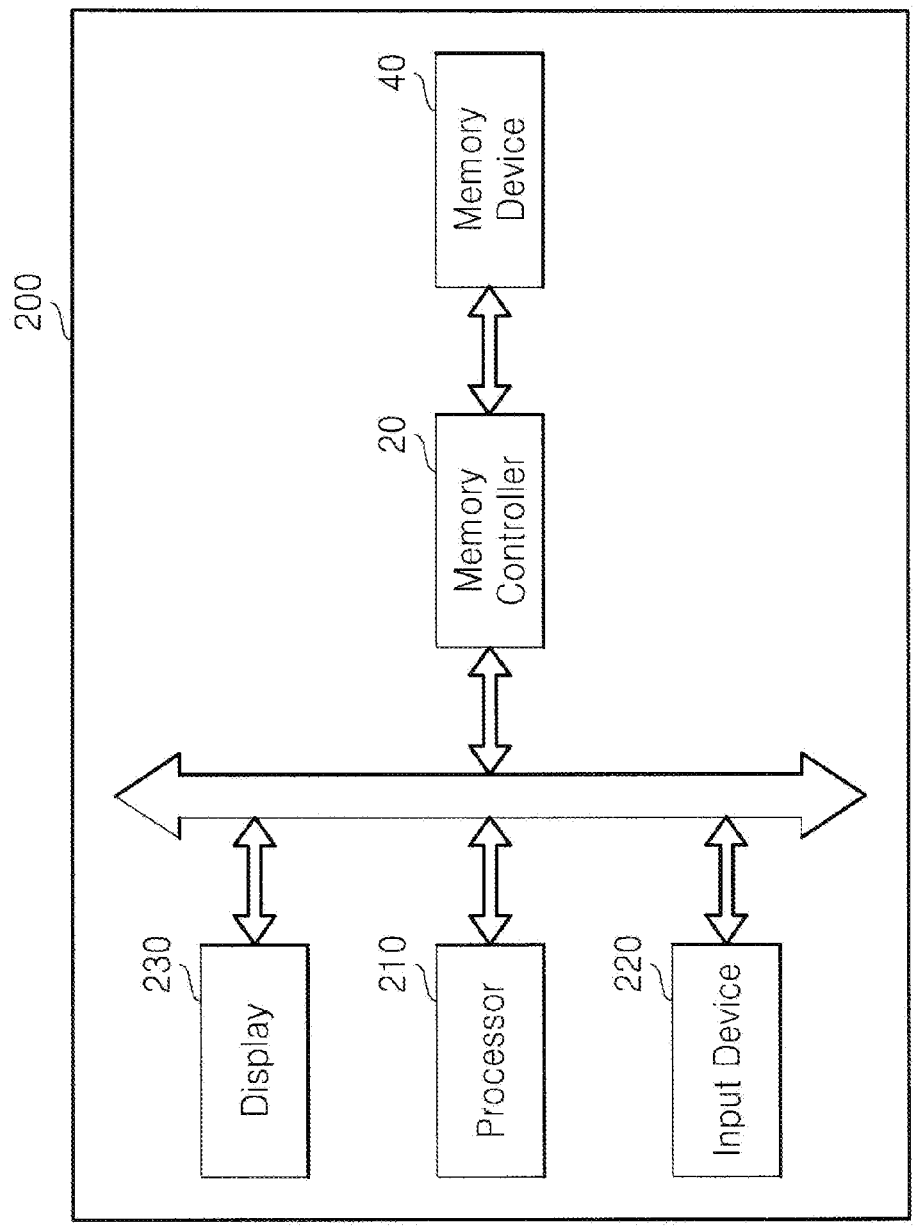
FIG. 12 is a diagram of an electronic device including the memory system illustrated in FIG. 1 according to example embodiments of inventive concepts.

FIG. 12 is a diagram of an electronic device 200 including the memory system 10 illustrated in FIG. 1 according to example embodiments of inventive concepts. Referring to FIG. 12, the electronic device 200 may be implemented as a PC, a laptop computer, a net-book, an e-reader, a portable multimedia player (PMP), an MP3 player, or an MP4 player.

The electronic device 200 includes the non-volatile memory device 40 and the memory controller 20 controlling the data processing operations of the non-volatile memory device 40.

A processor 210 may display data stored in the non-volatile memory device 40 through a display 230 according to data input through an input device 220. The input device 220 may be implemented by a pointing device such as a touch pad or a computer mouse, a keypad, or a keyboard. The input device 220 may be an interface that interfaces data with other devices.

The processor 210 may control the overall operation of the electronic device 200 and the operations of the memory controller 20. The memory controller 20, which may control the operations of the non-volatile memory device 40, may be implemented as a part of the processor 210 or as a chip separated from the processor 210.

Figure 13:
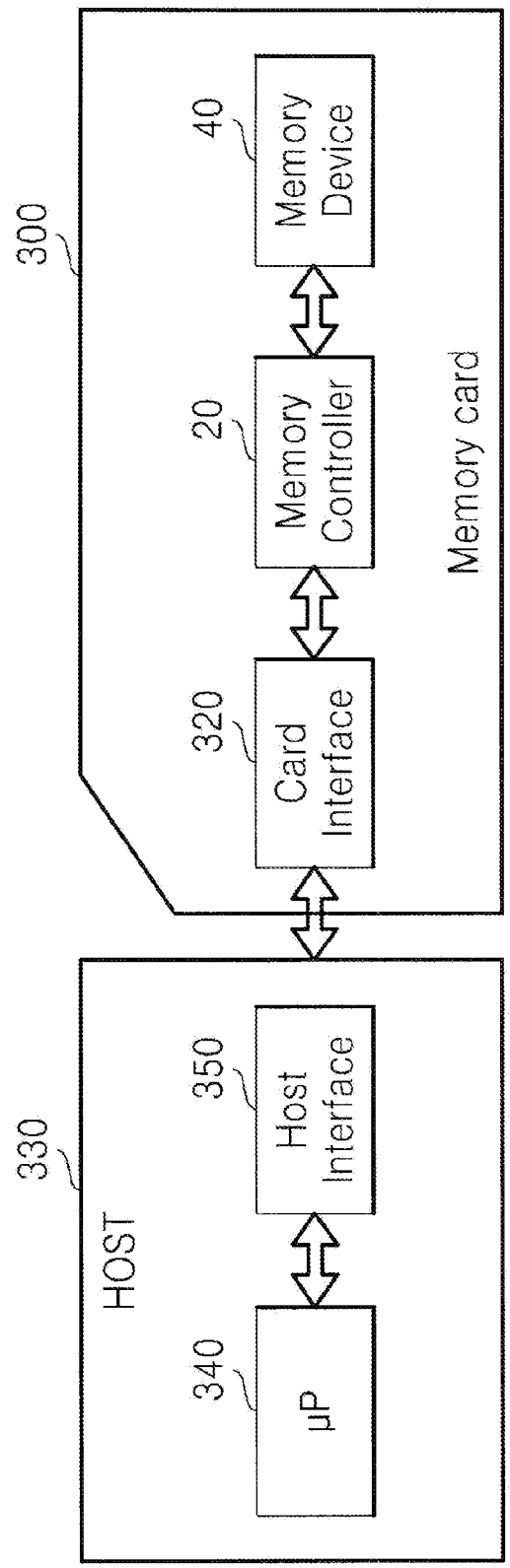
FIG. 13 is a diagram of an electronic device including the memory system illustrated in FIG. 1 according to example embodiments of inventive concepts.

FIG. 13 is a diagram of an electronic device 300 including the memory system 10 illustrated in FIG. 1 according to example embodiments of inventive concepts. For ease of description, a host 330 is illustrated with the electronic device 300 in FIG. 13. The electronic device 300 may be implemented as a memory card or a smart card. The memory card, which is an electronic flash memory data storage device used to store digital information, may be a PC card, a multimedia card (MMC), an embedded MMC, a secure digital (SD) card, or a universal serial bus (USB) flash drive.

The electronic device 300 like the memory card includes the memory controller 20, the non-volatile memory device 40, and a card interface 320. The memory controller 20 may control data exchange between the non-volatile memory device 40 and the card interface 320. The card interface 320 may be an SD card interface or an MMC interface, but the inventive concept is not restricted to the current embodiments.

The card interface 320 may interface the host 330 and the memory controller 20 for data exchange according to a protocol of the host 330. The card interface 320 may support a USB protocol and an interchip (IC)-USB protocol. Here, the card interface 320 may indicate a hardware supporting a protocol used by the host 330, a software installed in the hardware, or a signal transmission mode.

When the electronic device 300 is connected with the host 330 such as a PC, a laptop computer, a tablet PC, a digital camera, a digital audio player, a cellular phone, a video game console, an MP3 player, a PMP, an e-book, or a digital set-top box, a host interface 350 of the host 330 may perform data communication with the non-volatile memory device 40 through the card interface 320 and the memory controller 20 according to the control of a microprocessor 340.

Figure 14:
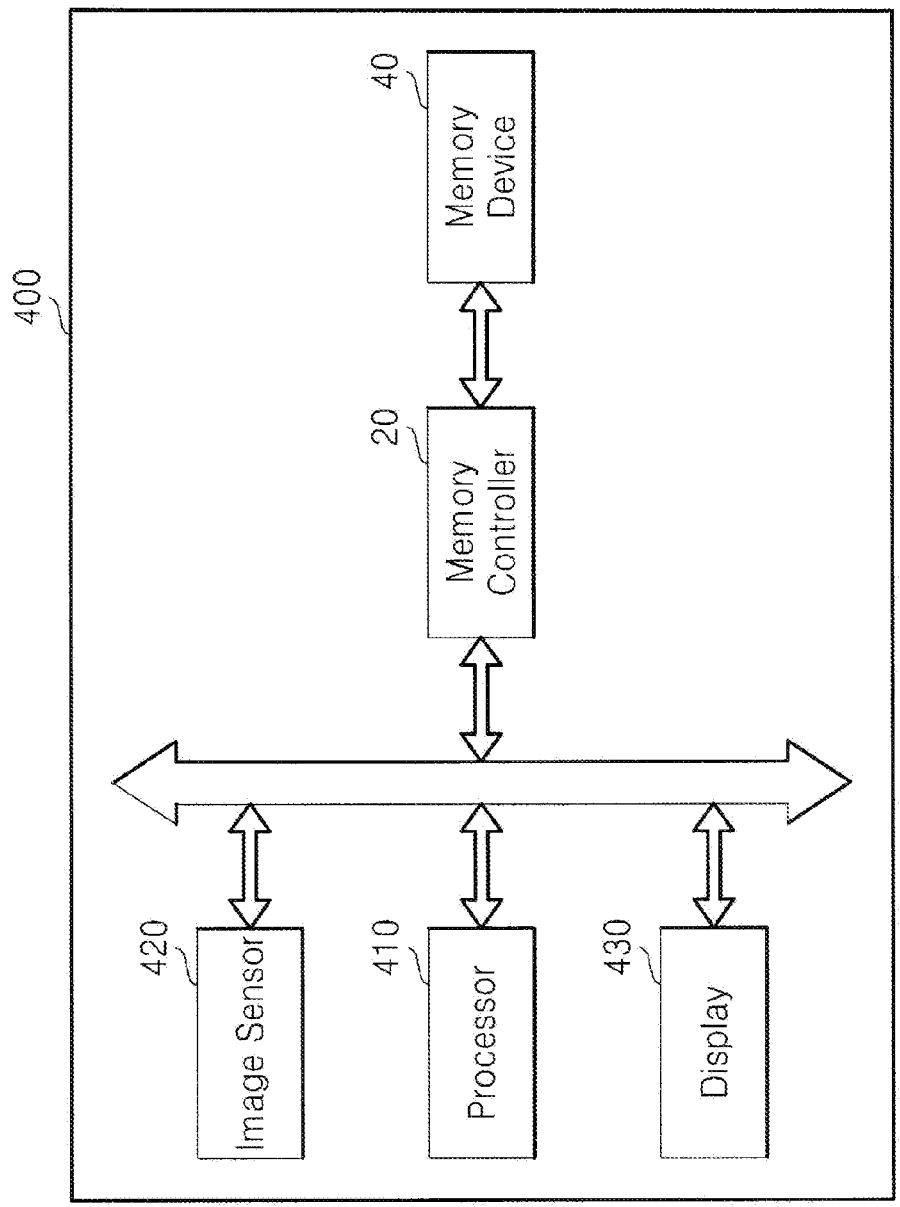
FIG. 14 is a diagram of an electronic device including the memory system illustrated in FIG. 1 according to example embodiments of inventive concepts.

FIG. 14 is a diagram of an electronic device 400 including the memory system 10 illustrated in FIG. 1 according to example embodiments of inventive concepts. The electronic device 400 may be implemented as an image processor like a digital camera, a cellular phone equipped with a digital camera, a smart phone equipped with a digital camera, or a tablet PC equipped with a digital camera.

The electronic device 400 includes the non-volatile memory device 40 and the memory controller 20 controlling the data processing operations, such as a program operation, an erase operation, and a read operation, of the non-volatile memory device 40.

An image sensor 420 included in the electronic device 400 converts optical images into digital image signals and outputs the digital image signals to a processor 410 or the memory controller 20. According to the control of the processor 410, the digital image signals may be displayed through a display 430 or stored in the non-volatile memory device 40 through the memory controller 20.

Data stored in the non-volatile memory device 40 may be displayed through the display 430 according to the control of the processor 410 or the memory controller 20. The memory controller 20, which may control the operations of the non-volatile memory device 40, may be implemented as a part of the processor 410 or as a chip separated from the processor 410.

Figure 15:
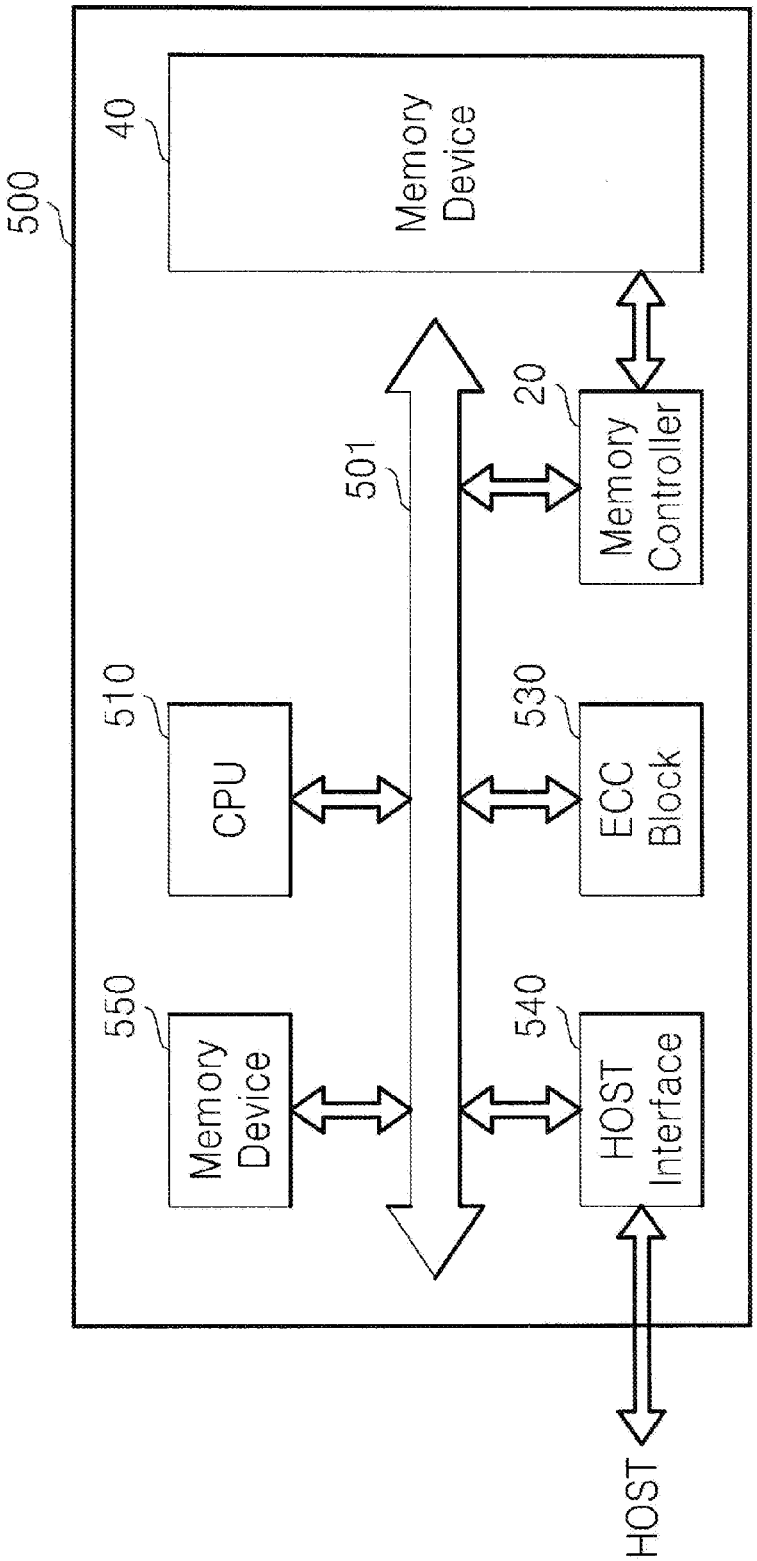
FIG. 15 is a diagram of an electronic device including the memory system illustrated in FIG. 1 according to example embodiments of inventive concepts.

FIG. 15 is a diagram of an electronic device 500 including the memory system 10 illustrated in FIG. 1 according to example embodiments of inventive concepts. The electronic device 500 includes the non-volatile memory device 40 and the memory controller 20 controlling the operations of the non-volatile memory device 40.

The electronic device 500 also includes a memory device 550 that may be used as an operation memory of the central processing unit (CPU) 510. The memory device 550 may be implemented by a non-volatile memory like ROM or a volatile memory like SRAM. A host connected with the electronic device 500 may perform data communication with the non-volatile memory device 40 through the memory controller 20 and a host interface 540.

An ECC block 530 is controlled by the CPU 510 to detect an error bit included in data output from the non-volatile memory device 40 through the memory controller 20, correct the error bit, and transmit the error-corrected data to the host through the host interface 540. The ECC block 530 may not be included in the electronic device 500 in. The CPU 510 may control data communication among the memory controller 20, the ECC block 530, the host interface 540, and the memory device 550 through a bus 501.

The electronic device 500 may be implemented as a flash memory drive, a USB memory drive, an IC-USB memory drive, or a memory stick.

Figure 16:
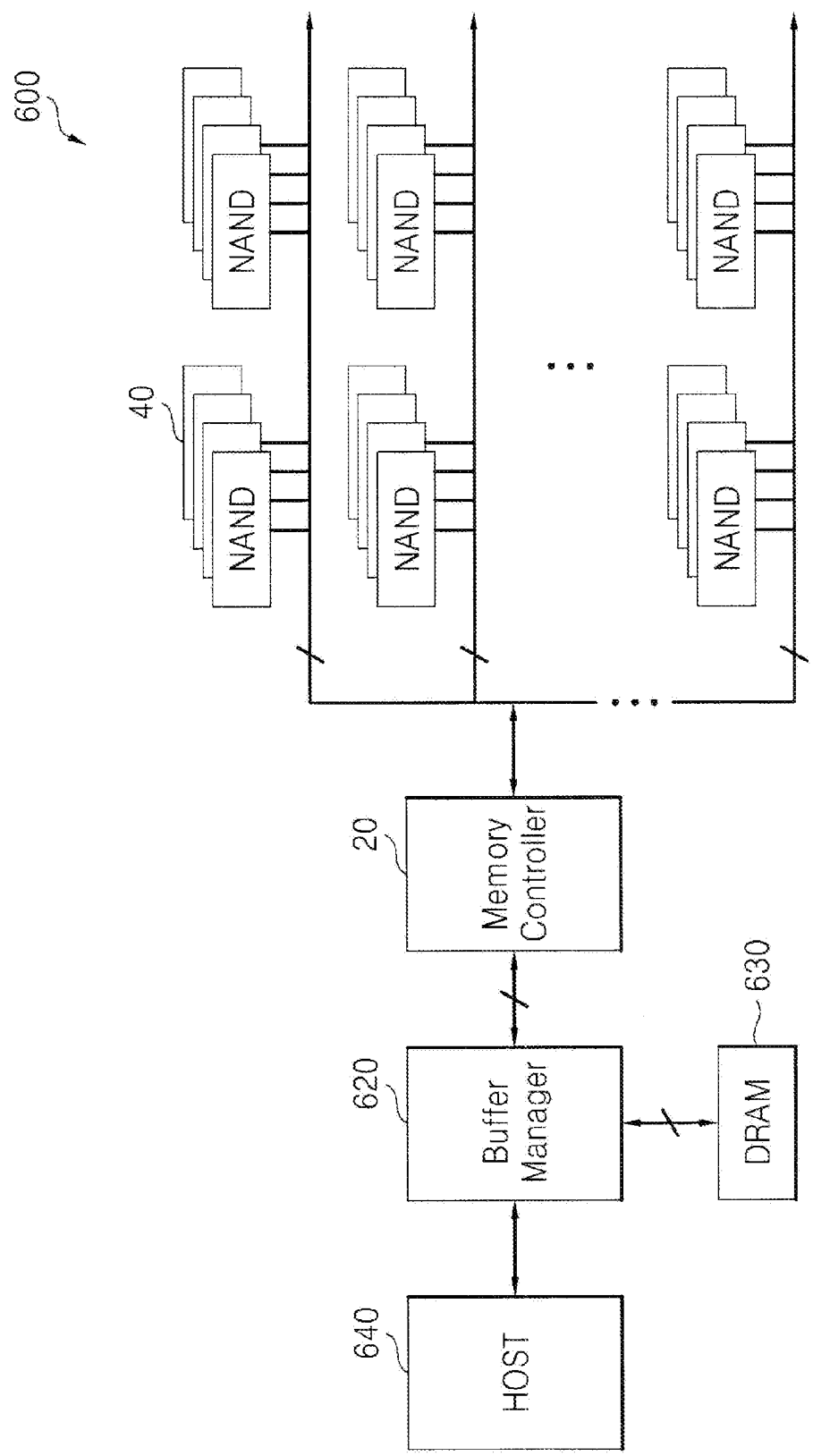
FIG. 16 is a diagram of an electronic device including the memory system illustrated in FIG. 1 according to example embodiments of inventive concepts.

FIG. 16 is a diagram of an electronic device 600 including the memory system 10 illustrated in FIG. 1 according to example embodiments of inventive concepts. The electronic device 600 may be implemented as a data storage system like a solid state drive (SSD). The electronic device 600 includes a plurality of solid state memory devices 40, the memory controller 20, a volatile memory device 630, and a buffer manager 620.

The memory controller 20 may control the data processing operations of the solid state memory devices 40. Each of the solid state memory devices 40 may be implemented by the non-volatile memory device 40, e.g., a NAND flash memory device, illustrated in FIG. 1. Each solid state memory device 40 includes a plurality of pages. The memory controller 20 may program data to a page included in one of the solid state memory devices 40.

The volatile memory device 630 may be implemented by DRAM. It temporarily stores data transferred between the memory controller 20 and a host 640. The buffer manager 620 may control the data buffering operation of the volatile memory device 630 and/or the memory controller 20.

Figure 17:
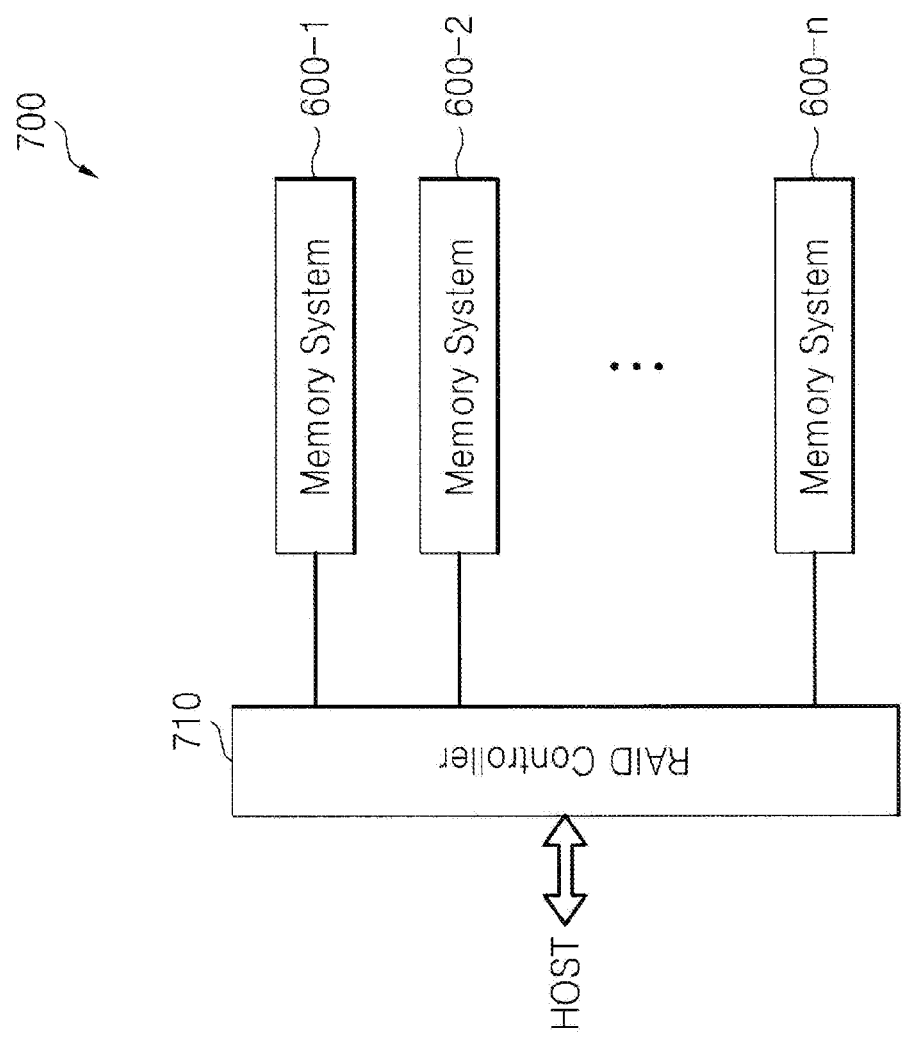
FIG. 17 is a block diagram of a data processing system including the electronic device illustrated in FIG. 16.

FIG. 17 is a block diagram of a data processing system 700 including the electronic device 600 illustrated in FIG. 16. Referring to FIG. 17, the data processing system 700 may be implemented as a redundant array of independent disks (RAID) system. The data processing system 700 may include a RAID controller 710 and a plurality of electronic devices 600-1 through 600-n where "n" is a natural number.

Each of the electronic devices 600-1 through 600-n may be the electronic device 600 illustrated in FIG. 16. The electronic devices 600-1 through 600-n may form a RAID array. The data processing system 700 may be a PC, a network-attached storage, or an SSD. Each of the electronic devices 600-1 through 600-n may be a memory system implemented in a form of a memory module.

During a program operation, the RAID controller 710 may transmit data output from a host to at least one of the electronic devices 600-1 through 600-n according to a RAID level in response to a program command received from the host.

During a read operation, the RAID controller 710 may transmit to the host data read from at least one of the electronic devices 600-1 through 600-n in response to a read command received from the host.

As described above, when a method of controlling a memory controller and a memory system including the memory controller according to example embodiments of inventive concepts are used, the speed of a read operation of a non-volatile memory device including MLCs is increased and a read failure rate is decreased.

While some example embodiments have been particularly shown and described, it will be understood by one of ordinary skill in the art that variations in form and detail may be made therein without departing from the spirit and scope of the claims.

What is claimed is:

1. A method of controlling a memory system including a memory controller and non-volatile memory, the method comprising:
executing an error correction code (ECC) on first page data that has been read from a non-volatile memory device using a first read voltage level at the memory controller;
reading metadata of second page data when an uncorrectable error is detected in the first page data according to a result of executing the ECC, the first page data and the metadata of the second page data not having any page data in common;
estimating a second read voltage level for re-reading the first page data using the metadata of the second page data; and
re-reading the first page data using the second read voltage level.

2. The method of claim 1, wherein the estimating the second read voltage level includes:
transmitting a second page data read command to the non-volatile memory device when the uncorrectable error is detected in the first page data according to the result of executing the ECC;
receiving the metadata of the second page data, which is transmitted from the non-volatile memory device in response to the second page data read command;
estimating a read voltage level for reading the second page data based on the metadata of the second cage data; and
calculating the second read voltage level for the re-reading the first page data based on the read voltage level estimated for reading the second page data.

3. The method of claim 2, wherein the estimating the read voltage level for reading the second page data includes estimating the read voltage level for reading the second page data so that a difference between a first number of particular bits among bits included in the second page data when the second page data is programmed and a second number of the particular bits included in the second page data that has been read from the non-volatile memory device is at least one of reduced and minimized,
wherein the metadata of the second page data includes the first number of the particular bits of the second page data.

4. The method of claim 2, wherein the calculating the second read voltage level for the re-reading the first page data includes reading the second read voltage level corresponding to the estimated read voltage level from a look-up table.

5. The method of claim 1, further comprising:
transmitting to the non-volatile memory device a read voltage change command for changing a read voltage level for the first page data from the first read voltage level to the second read voltage level.

6. The method of claim 5, further comprising:
transmitting a first page data read command to the non-volatile memory device; and
receiving the first page data that has been read from the non-volatile memory device using the second read voltage level in response to the first page read command.

7. The method of claim 1, wherein the first page data and the second page data are read from a common page of the non-volatile memory device.

8. The method of claim 1, wherein
the first page data is one of most significant bit (MSB) page data and central significant bit (CSB) page data, and
the second page data is least significant bit (LSB) page data.

9. A memory system comprising:
a non-volatile memory device; and
a memory controller configured to control the non-volatile memory device, wherein
the memory controller is configured to execute an error correction code (ECC) on first page data that has been read from the non-volatile memory device using a first read voltage level,
the memory controller is configured to transmit a second page data read command to the non-volatile memory device when an uncorrectable error is detected in the first page data according to the result of executing the ECC,
the memory controller is configured to receive metadata of second page data from the non-volatile memory device, the first page data and the metadata of the second page data not having any page data in common,
the non-volatile memory device being configured to transmit the metadata of the second page data to the memory controller in response to the second page data read command,
the memory controller is configured to calculate a read voltage level for the second page data based on the metadata, the memory controller is configured to calculate a second read voltage level for reading the first page data based on the read voltage level calculated for the second page data, and the memory controller is configured to transmit a read voltage change command to the non-volatile memory device, the read voltage change command including information about the second read voltage level to the non-volatile memory device.

10. The memory system of claim 9, wherein
the memory controller is configured to transmit a first page data read command to the non-volatile memory device,
the non-volatile memory device is configured to read the first page data using the second read voltage level, and
the non-volatile memory device is configured to transmit the first page data that has been read to the memory controller.

11. The memory system of claim 9, wherein the metadata includes information about a number of particular bits among bits included in the second page data when the second page data is programmed.

12. The memory system of claim 9, wherein
the first page data is one of most significant bit (MSB) page data and central significant bit (CSB) page data, and
the second page data is least significant bit (LSB) page data.

13. The memory system of claim 9, wherein the memory system is a multi-chip package that includes the non-volatile memory device and the memory controller.

14. The memory system of claim 9, wherein the memory system is one of a memory card, a smart card, and a solid state drive (SSD).

15. A memory system comprising:
a memory controller connected to a non-volatile memory device,
the memory controller being configured to issue a first command to the non-volatile memory device,
the non-volatile memory device being configured to transmit first page data that has been read using a first read voltage level to the memory controller in response to the first command,
the memory controller being configured to issue a second command to the non-volatile memory device when the memory controller detects an uncorrectable error in the first page data,
the non-volatile memory device being configured to transmit metadata of second page data to the memory controller in response to the second command, the first page data and the metadata of the second page data not having any page data in common,
the memory controller being configured to estimate a read voltage amount for the non-volatile memory device to read second page data, based on the metadata of second page data,
the memory controller being configured to determine a second read voltage level, based on the read voltage amount, for the non-volatile memory device to read first page data,
the memory controller being configured to issue a third command to the non-volatile memory device, and
the non-volatile memory device being configured to read first page data using the second read voltage level in response to the third command.

16. The memory system of claim 15, wherein the memory controller is configured to determine the second read voltage level by selecting a value for the second read voltage level corresponding to the read voltage amount from a lookup table.

17. The memory system of claim 15, wherein the memory system is a multi-chip package that includes the non-volatile memory device and the memory controller.

18. The memory system of claim 15, wherein
the memory controller is configured to issue a fourth command to the non-volatile memory device after the memory controller issues the third command, and
the non-volatile memory device is configured to read the first page data using the second read voltage level such that the first page data read using the second read voltage level has fewer uncorrectable errors than the first page data read using the first read voltage level.

19. The memory system of claim 15, further comprising:
a substrate supporting the memory controller and the non-volatile memory device.

20. The memory system of claim 15, wherein
the first page data is one of most significant bit (MSB) page data and central significant bit (CSB) page data, and
the second page data is least significant bit (LSB) page data.

* * * * *